United States Patent [19]

Tseng

[11] Patent Number: 5,710,078
[45] Date of Patent: Jan. 20, 1998

[54] METHOD TO IMPROVE THE CONTACT RESISTANCE OF BIT LINE METAL STRUCTURES TO UNDERLYING POLYCIDE STRUCTURES

[75] Inventor: Horng-Huei Tseng, Hsinchu, Taiwan

[73] Assignee: Vanguard International Semiconductor Corporation, Hsin-Chu, Taiwan

[21] Appl. No.: 657,133

[22] Filed: Jun. 3, 1996

[51] Int. Cl.$^6$ ............................................ H01L 21/4763
[52] U.S. Cl. ..................... 438/620; 438/638; 438/583; 438/238; 148/DIG. 20
[58] Field of Search .................. 438/620, 637–638, 438/651–652, 582–583, 238; 148/DIG. 20

[56] References Cited

U.S. PATENT DOCUMENTS

| | | | |
|---|---|---|---|
| 5,399,235 | 3/1995 | Mutsaers et al. | 156/636 |
| 5,457,070 | 10/1995 | Hirade | 438/637 |
| 5,476,814 | 12/1995 | Ohshima et al. | 438/620 |
| 5,576,243 | 11/1996 | Wuu et al. | 438/381 |

OTHER PUBLICATIONS

H.W. Chung et al. "Evaluations of Borderless Vias for Sub–Half Micron Technologies", Pub Jun. 27–29, 1995, VMIC Conference, pp. 667–669.

*Primary Examiner*—Jey Tsai
*Attorney, Agent, or Firm*—George O. Saile; Stephen B. Ackerman

[57] ABSTRACT

A method for reducing the contact resistance of an overlying metal bit line structure, to underlying polycide gate structure, has been developed. A borderless, or non-fully landed contact hole, is opened in an insulator layer, to expose the top surface of the underlying polycide gate structure. The anisotropic, dry etching of the insulator is then continued, resulting in the exposure of a portion of the sides of the polycide gate structure. A subsequent bit line metal structure, now contacts both the top surface, as well as a portion of the sides, of the polycide gate structure, resulting in a contact resistance reduction, due to the increased contact area.

22 Claims, 4 Drawing Sheets

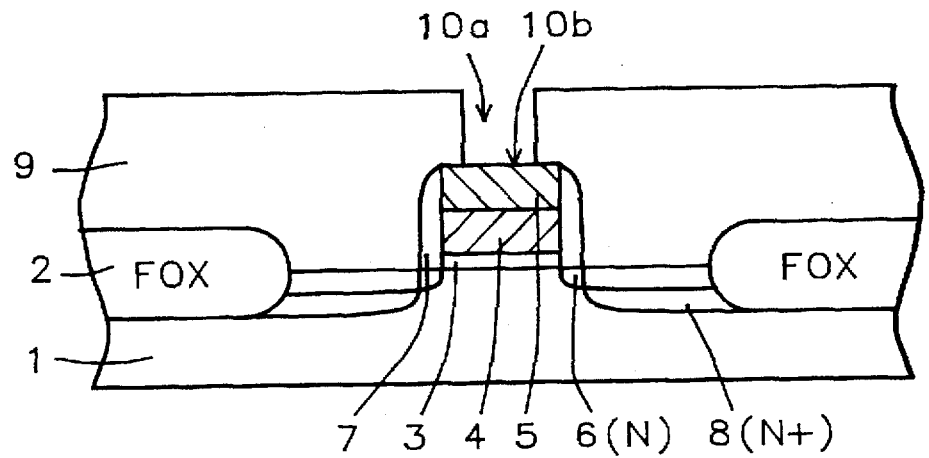
FIG. 1a – Prior Art
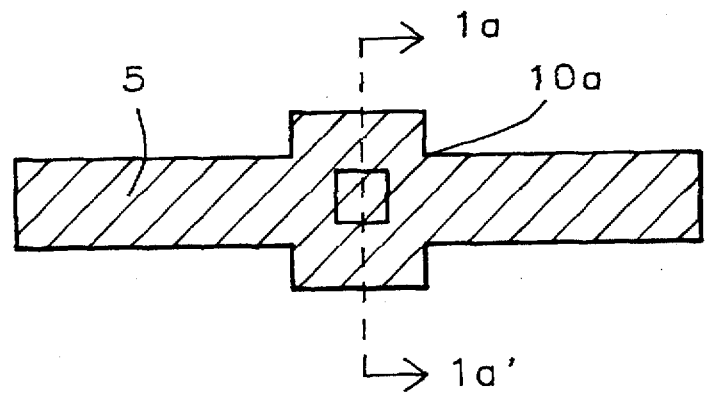
FIG. 1b – Prior Art

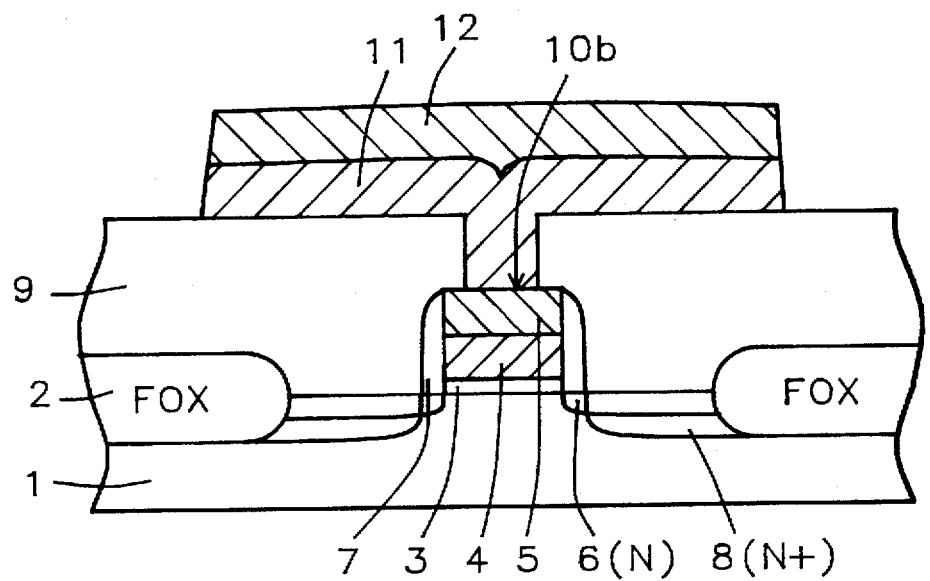
FIG. 2 - Prior Art
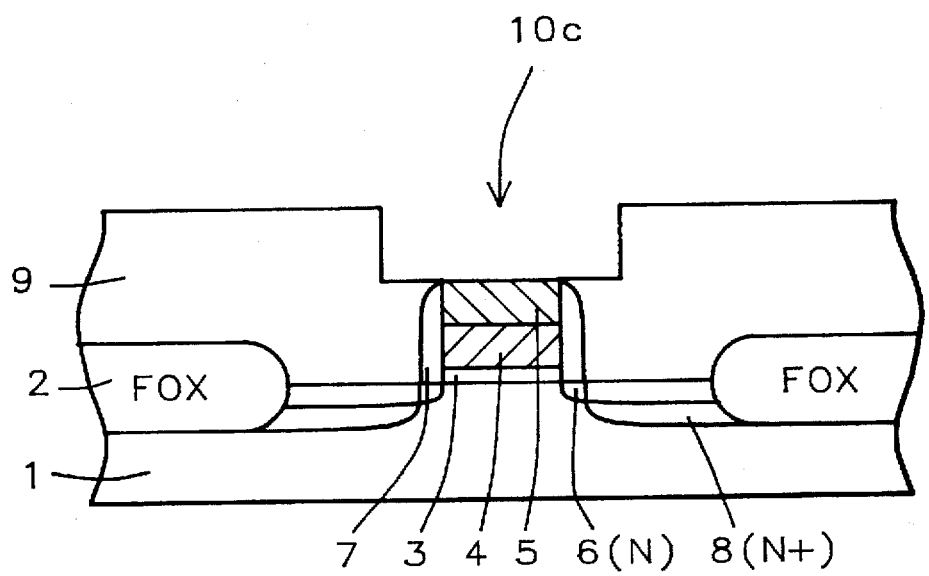
FIG. 3

METHOD TO IMPROVE THE CONTACT RESISTANCE OF BIT LINE METAL STRUCTURES TO UNDERLYING POLYCIDE STRUCTURES

BACKGROUND OF THE INVENTION

(1) Field of the Invention

The invention relates to methods used to fabricate semiconductor devices, and more specifically to a method used to optimize the contact resistance between conductive structures on a semiconductor substrate.

(2) Description of the Prior Art

The semiconductor industry is continually striving to improve the performance of semiconductor devices, while still maintaining, or reducing the cost of semiconductor devices. These objectives are being successfully addressed via micro-miniaturization, or the ability to create semiconductor devices with sub-micron features. Smaller devices result in decreases in parasitic capacitances, as well as decreases in wiring resistances, both allowing increased performance to be realized. In addition, smaller features allow the same level of integration to be obtained via the use of smaller silicon chips, thus allowing more silicon chips to be obtained for a specific size starting wafer, thus reducing the processing cost of a specific silicon chip. However the advent of micro-miniaturization, although benefitting performance and cost objectives, present fresh problems for the semiconductor fabrication community.

The trend to high density, dynamic random access memory, (DRAM), devices, has benefitted greatly from micro-miniaturization. Smaller features applied to source and drain regions, isolation regions, as well as gate electrode structures, have allowed narrower channel lengths to be realized, in turn allowing 64 MB,(megabyte), DRAM densities to be achieved. However smaller features, such as narrower gate electrode structures, have also presented new challenges to the semiconductor fabrication engineer. For example contact or via hole openings in an insulator layer, to a polycide gate electrode, composed of a metal silicide layer on an underlying polysilicon layer, are usually designed to be fully landed on the polycide structure. The design of allowing only fully landed openings, along with the use of narrow polycide gate structures, results in extremely small contact or via holes. This is turn can result in increased contact or interface resistances between an overlying bit line metal structure and the underlying polycide gate structure, due to the decreased contact area. In addition the top surface of the polycide gate structure, when subjected to a selective, anisotropic reactive ion etching, (RIE), ambient, at the completion of small contact or via hole opening procedure, can be adversely influenced by the RIE reactants, to a level in which the contact or interface resistance of a subsequent overlying bit line metallization, to the underlying polycide gate structure, can be unacceptably higher then desired.

This invention will describe a process in which non-fully landed, or borderless contact holes are opened in an insulator layer, to expose the top surface of an underlying polycide gate structure. H. W. Chung, et al, in "Evaluations of Borderless Vias for Sub-half Micron Technologies", pub. Jun. 27–29, 1995, 1995 VMIC Conference, pp 667–669, describe via resistance as a function of overlap, without offering specific processing or design solutions, needed to minimize interface resistances. However in this invention solutions are offered for achieving decreased contact or interface resistance. The borderless via concept is extended to include an overetch cycle used to increase the amount of available contact area. After the hole opening process exposes the top surface of the underlying polycide gate structure, the hole opening process continues to a level in which a portion of the sides of the polycide gate structure are exposed. This increase in surface area, will now provide a greater level of surface area available for overlying bit line metal structure contact. In addition the sides of the polycide gate structure, now exposed, offer a surface not adversely influenced by the anisotropic RIE procedure, thus offering a potentially cleaner surface for contact by a subsequent overlying bit line metallization.

SUMMARY OF THE INVENTION

It is an object of this invention to reduce the contact resistance between an overlying bit line metal structure and an underlying polycide gate structure.

It is another object of this invention open a contact hole in an insulator layer, to a polycide gate structure, with the contact hole being larger in width, then the width of the polycide gate structure.

It is yet another object of this invention to continue the insulator etching in the contact hole opening, after the top surface of the polycide gate structure has been exposed, to expose the sidewalls of the polycide gate structure, and thus increase the surface area of the polycide gate structure, available for contact by a subsequent overlying bit line metal structure.

In accordance with the present invention a method for reducing the contact resistance between an overlying metal bit line structure, and an underlying polycide gate structure, is described. A gate oxide layer is grown on a semiconductor substrate, followed by the deposition of a polysilicon layer, and an overlying metal silicide layer. After formation of a polycide gate structure, accomplished via conventional photolithographic procedures, and anisotropic, reactive ion etching, (RIE), of the metal silicide and polysilicon layers, an insulator layer is chemically vapor deposited. Conventional photolithographic procedures, and selective, anisotropic, RIE procedures are used to open a contact hole in the insulator layer, to expose the top surface of the polycide structure, with the width of the contact hole, larger then the width of the polycide gate structure. After exposure of the top surface of the polycide gate structure, the selective, anisotropic, RIE procedure is continued to remove insulator from the contact hole, and to expose a portion of the sides of the polycide gate structure. Another layer of polysilicon, and of metal silicide, are deposited, and patterned to form a bit line metal structure, with the bit line metal structure contacting the underlying polycide gate structure on the sides, as well as on the top surface.

BRIEF DESCRIPTION OF THE DRAWINGS

The object and other advantages of this invention are best described in the preferred embodiment with reference to the attached drawings that include:

FIG. 1a, which schematically, in cross-sectional style, shows prior art, and a contact hole, in an insulator layer, opened to a underlying polycide gate structure, with the contact hole being fully landed on the underlying polycide gate structure.

FIG. 1b, which shows the top view of the prior art structure, shown in FIG. 1a.

FIG. 2, which schematically, in cross-sectional style, shows prior art, and the bit line metal structure contacting the top surface of an underlying polycide gate structure, with the contact hole being fully landed on the polycide gate structure.

FIG. 3, which schematically, in cross-sectional style, shows a contact hole, in an insulator layer, opened to the top surface of an underlying polycide gate structure, with the width of the contact hole being larger then the width of the polycide gate structure.

FIG. 4b, which shows the top view of the structure shown in FIG. 4a.

DESCRIPTION OF THE PREFERRED EMBODIMENTS

Figure 4A:
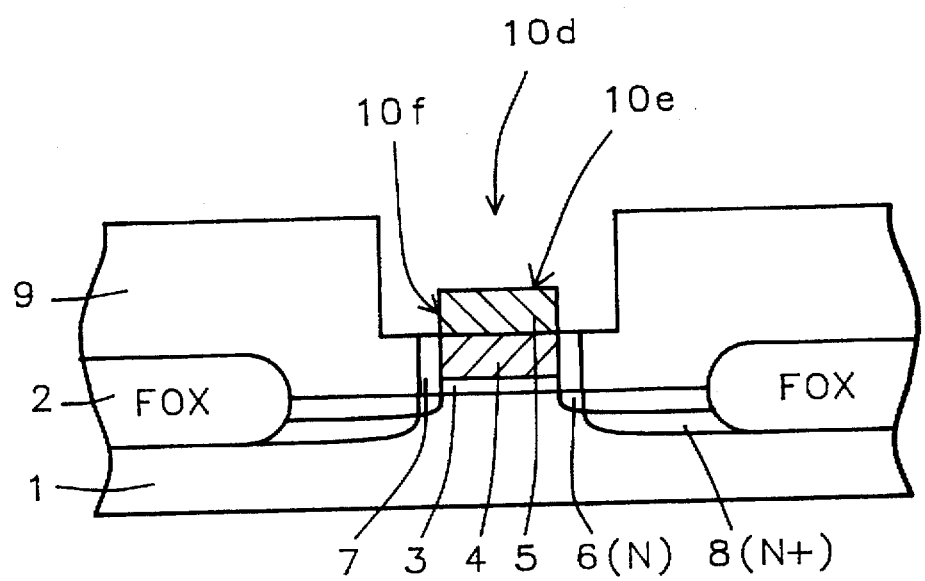
FIG. 4a, which schematically, in cross-sectional style, shows a contact hole, in an insulator layer, opened deeper then the top surface of the polycide gate structure, exposing a portion of the sides of the polycide gate structure.

The method for improving the contact resistance between an overlying bit line metal structure and an underlying polycide gate structure, will now be covered in detail. This invention can be used to more effectively fabricate high density, DRAM devices, that are being manufactured in industry, therefore only the specific areas unique to understanding this invention will be described in detail.

FIG. 1a, schematically shows, prior art of a transfer gate transistor, used in DRAM technologies. A substrate, 1, composed of P type, single crystalline silicon, with a <100>crystallographic orientation, is used. A field oxide, (FOX), region, 2, is formed in the surface of silicon substrate, 1. This is accomplished by creating an oxidation mask of a thin thermal oxide, followed by a low pressure chemical vapor deposition, (LPCVD), of a thin layer of silicon nitride. After photolithographic and RIE procedures, used to create the desired mask image in the silicon nitride—thermal oxide composite layer, and the removal of photoresist, the FOX region, 2, is grown in non-masked regions, at a temperature between about 900° to 1050° C., in an oxygen—steam ambient, to a thickness between about 4000 to 6000 Angstroms. After removal of the composite mask layer, using hot phosphoric acid for the silicon nitride layer, and a buffered hydrofluoric acid solution for the thin thermal oxide layer, a silicon dioxide, gate insulator layer, 3, is grown, again in an oxygen—steam ambient, at a temperature between about 850° to 950° C., to a thickness between about 50 to 300 Angstroms. Next a layer of polysilicon, 4, is deposited, using LPCVD procedures, at a temperature between about 530° to 580° C., to a thickness between about 1000 to 2000 Angstroms. Polysilicon layer, 4, can be grown using insitu doping procedures, via the addition of either arsine or phosphine to a silane ambient, or polysilicon layer, 4, can be deposited intrinsically, and doped via ion implantation of either arsenic or phosphorous, at an energy between about 30 to 100 KeV, at a dose between about 5E13 to 5E15 atoms/cm$^2$. A layer of tungsten silicide, 5, is next deposited using LPCVD processing, at a temperature between about 320° to 380° C., to a thickness between about 1000 to 2000 Angstroms, using silane and tungsten hexafluoride as reactants. Conventional photolithographic and RIE procedures, using Cl$_2$ as an etchant, are employed to create a polycide gate structure, of tungsten silicide—polysilicon, width the width of the polycide gate structure being between about 2500 to 7000 Angstroms. Photoresist removal is performed using plasma oxygen ashing.

A lightly doped source and drain region, 6, shown in FIG. 1b, is created via ion implantation of phosphorous, at an energy between about 30 to 70 KeV, at a dose between about 1E12 to 5E13 atoms/cm$^2$. An insulator layer of silicon oxide, is deposited using either LPCVD or plasma enhanced chemical vapor deposition, (PECVD), processing, at a temperature between about 500° to 800° C., to a thickness between about 1500 to 4000 Angstroms, using tetraethylorthosilicate, (TEOS), as a source. A blanket, anisotropic, RIE procedure, using CHF$_3$ as an etchant, is employed to create insulator spacer, 7, on the sidewalls of the polycide gate structure. A heavily doped source and drain region, 8, is next formed via ion implantation of either arsenic or phosphorous, at an energy between about 50 to 100 KeV, at a dose between about 1E13 to 1E15 atoms/cm$^2$. Another layer of silicon oxide, 9, is deposited using either LPCVD, at a temperature between about 700° to 750° C., or PECVD processing, at a temperature between about 300° to 400° C., to a thickness between about 3000 to 10000 Angstroms. Photolithographic and RIE procedures, using CHF$_3$ as an etchant, are used to create contact hole opening, 10a, in insulator layer, 9, exposing the top surface, 10b, of tungsten silicide layer, 5, with the RIE procedure terminating with an overetch cycle to insure complete removal of silicon oxide layer, 9, from the surface of tungsten silicide layer, 5. The width of contact hole opening, 10a, fully landed on the wider polycide gate structure, is between about 2500 to 7000 Angstroms. Photoresist removal is accomplished via plasma oxygen ashing. This is shown schematically in the top view, shown in FIG. 1b.

The bit line metal structure, used to contact the underlying polycide gate structure, via the use of a fully landed contact opening, is shown for prior art in FIG. 2. A layer of polysilicon, 11, is deposited, using LPCVD procedures, at a thickness between about 1000 to 2000 Angstroms, using deposition and doping conditions, identical to conditions previously described for polysilicon layer, 4. Next another tungsten silicide layer, 12, is deposited, using LPCVD procedures, at a thickness between about 1000 to 2000 Angstroms, using deposition conditions identical to conditions previously described for tungsten silicide layer, 5. Photolithographic and RIE procedures, using Cl$_2$ as an etchant, are used to create the bit line metal structure of tungsten silicide–polysilicon. Photoresist removal is once again performed using plasma oxygen ashing. This structure can result in contact or interface resistance, at interface 10b, between the polysilicon layer, 11, and tungsten silicide layer, 5, larger then desired. First, the amount of contact area is limited by the design of fully landing the contact hole on the underlying polycide gate structure. In addition, surface 10b, of tungsten silicide layer, 5, has been subjected to the selective, anisotropic, RIE procedures, used to insure complete removal of insulator layer, 9, from the surface of tungsten silicide layer, 5. The selectivity, being the greater rate of removal of insulator material, compared to the slower removal rate of tungsten silicide, in a CHF$_3$ ambient. The exposure of tungsten silicide, top surface, 10b, to CHF$_3$, during the overetch cycle, can result in a surface that will result in a larger interface resistance, then surfaces not exposed to the CHF$_3$, RIE overetch cycle.

Figure 4B:
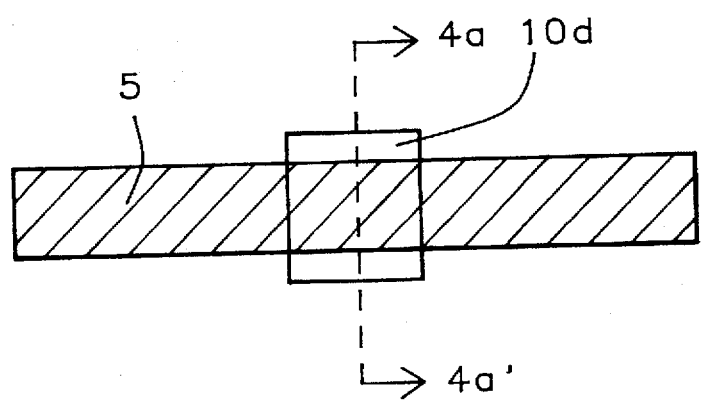
Figure 5:
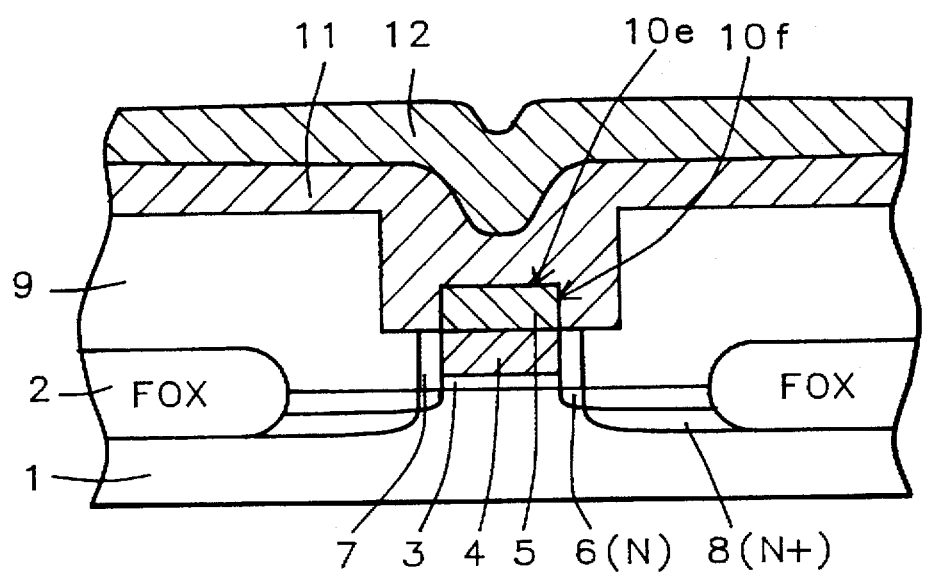
FIG. 5, which schematically, in cross-sectional style, shows a bit line metal structure contacting the top surface, as well as a portion of the sides, of an underlying polycide gate structure.

A method to improve the contact or interface resistance, between an overlying bit line metal structure and an underlying polycide gate structure, is described in FIGS. 3–5. FIG. 3, shows the identical N channel transistor, previously described in FIGS. 1–2. However in this procedure, contact hole opening 10cis borderless, or has not been designed to fully land on underlying polycide gate structure, and therefore is created larger in width, than the width of the underlying polycide gate structure, tungsten silicide, 5, - polysilicon, 4. The width of contact hole, 10c, is between about 4000 to 10000 Angstroms, compared to the width of polycide gate structure, of between about 3000 to 7000 Angstroms. FIG. 3, shows the contact hole opening, 10c, by removal of insulator layer, 9, via selective, anisotropic, RIE procedures, using $CHF_3$ as an etchant, to a point in which the top of the polycide gate structure is exposed. Next, a timed, additional, selective, anisotropic RIE procedure, is employed to remove an additional amount of insulator layer, 9, from the contact hole region, exposing a portion of the sides of the polycide gate structure, creating contact hole 10d, featuring the recessed insulator layer, 9. This is shown schematically in FIG. 4a. Insulator layer, 9, is recessed, in contact hole, 10d, to a level between about 500 to 1500 Angstroms, below the top surface of tungsten silicide layer, 5, exposing tungsten silicide sidewall surface, 10f, which has not been exposed to the deleterious, anisotropic component of the RIE procedure. FIG. 4b, shows a top view of this structure. Photoresist is removed using plasma oxygen ashing.

FIG. 5, shows the formation of a bit line metal structure, contacting the underlying polycide gate structure, in contact hole opening, 10d. Again, as previously described for FIG. 2, a layer of polysilicon, 11, and a layer of tungsten silicide, 12, are deposited, and patterned, using photolithographic and RIE procedures, to create the bit line metal structure. Photoresist removal is performed using plasma oxygen ashing. However unlike counterparts in which contact hole openings were fully landed on underlying polycide structures, this non-fully landed structure results in an increased amount of contact area by the additional surface area, 10f, made available by the recessing of insulator layer, 9, in non-fully landed regions. In addition surface area, 10f, is not subjected to the anisotropic component of the RIE procedure, and thus offers a surface, less damaged then surface, 10e, or surface, 10b, previously shown in FIG. 2, that had been subjected to the anisotropic RIE component. Therefore the contact or interface resistance between the bit line metal structure, and an underlying polycide gate structure, is reduced by an increase in available contact area, as well as the availability of undamaged contact surfaces.

Another iteration of this invention is to use non-fully landed contact holes, using selective, anisotropic RIE procedures, to expose the top surface of the underlying polycide gate structure, followed by the recessing of insulator layer, 9, via use of a buffered hydrofluoric acid solution. This iteration eliminates the exposure of surface, 10e, to the deleterious RIE ambient during the recessing of insulator layer, 9. An additional iteration is the opening of the non-fully landed contact hole, as well as the recessing of insulator layer, 9, via the use of a buffered hydrofluoric acid solution, this avoids the exposure of surface 10e, to any RIE procedure.

This method for reducing the contact resistance of bit line structures to underlying polycide gate structures, although shown as an application to an N channel, DRAM device, can also be applied to P channel devices. In addition this invention can be applied to complimentary metal oxide semiconductor, (CMOS), or bipolar - CMOS, (BiCMOS), structures.

While this invention has been particularly shown and described with reference to, the preferred embodiments thereof, it will be understood by those skilled in the art that various changes in form and detail may be made without departing from the spirit and scope of this invention.

What is claimed is:

1. A method of fabricating a device, on a semiconductor substrate, in which the contact resistance between an overlying metal structure, and an underlying gate structure, is reduced, comprising the steps of:

growing a gate dielectric layer on said semiconductor substrate;

deposition of a first polysilicon layer on said gate dielectric layer;

deposition of a first metal silicide layer on said first polysilicon layer;

patterning of said first metal silicide layer, and of said first polysilicon layer, to create a polycide gate structure;

ion implanting a first conductivity imparting dopant into said semiconductor substrate, in regions not covered by said polycide gate structure;

deposition of a first insulator layer;

anisotropic etching of said first insulator layer, to create an insulator spacer on sidewalls of said polycide gate structure;

ion implantation of a second conductivity imparting dopant into said semiconductor substrate, in regions not covered by said polycide gate structure, and not covered by said insulator spacer;

deposition of a second insulator layer;

opening a contact hole in said second insulator layer, to expose top surface of said polycide gate structure, with the width of said contact hole, greater than the width of said polycide gate structure, so that top surface of said insulator spacer, and surface of remaining said second insulator layer, are also exposed in said contact hole, in regions surrounding said polycide gate structure;

removal of a portion of said insulator spacer, and of a portion of said remaining second insulator layer, in said contact hole, exposing a portion of the sides of said polycide gate structure, in said contact hole;

deposition of a second polysilicon layer;

deposition of a second metal silicide layer; and patterning of said second metal silicide layer, and of said second polysilicon layer, to create said metal structure, contacting top surface of said polycide gate structure, as well as portion of sides, of said polycide gate structure, in said contact hole.

2. The method of claim 1, wherein said first polysilicon layer is deposited using LPCVD processing, at a temperature between about 530° to 580° C., to a thickness between about 1000 to 2000 Angstroms.

3. The method of claim 1, wherein said first metal silicide layer, is tungsten silicide, deposited using LPCVD processing, at a temperature between about 320° to 380° C., to a thickness between about 1000 to 2000 Angstroms.

4. The method of claim 1, wherein said polycide gate structure is formed via dry etching of overlying, said first metal silicide layer, and of underlying, said first polysilicon layer, with the width of said polycide gate structure between about 2500 to 7000 Angstroms.

5. The method of claim 1, wherein said insulator spacer is silicon oxide, at a width between about 1500 to 4000 Angstroms.

6. The method of claim 1, wherein said second insulator layer is silicon oxide, deposited using PECVD procedures, at a temperature between about 300° to 400° C., to a thickness between about 3000 to 10000 Angstroms.

7. The method of claim 1, wherein said contact hole, opened in said second insulator layer, is opened via RIE procedures, using $CHF_3$ as an etchant, exposing top surface of said polycide gate structure, with said contact hole having a width between about 4000 to 10000 Angstroms.

8. The method of claim 1, wherein said contact hole, opened in said second insulator layer, is opened using a buffered hydrofluoric acid solution, exposing top surface of said polycide gate structure, with said contact hole having a width between about 4000 to 10000 Angstroms.

9. The method of claim 1, wherein between about 500 to 1500 Angstroms of said remaining second insulator layer, and of said insulator spacer, in said contact hole, is removed via RIE procedures, using $CHF_3$ as an etchant.

10. The method of claim 1, wherein between about 500 to 1500 Angstroms of said remaining second insulator layer, and of said insulator spacer, in said contact hole, is removed using a buffered hydrofluoric acid solution.

11. The method of claim 1, wherein said metal structure contacting top surface, and contacting a portion of sides of said polycide gate structure, in said contact hole, is composed of an overlying, said second metal silicide layer, and an underlying, said second polysilicon layer.

12. A method of fabricating high density, DRAM devices, on a semiconductor substrate, in which the contact resistance between an overlying bit line metal structure, and an underlying polycide gate structure, is reduced, comprising the steps of:

growing a gate dielectric layer on said semiconductor substrate;

deposition of a first polysilicon layer on said gate dielectric layer;

deposition of a first tungsten silicide layer on said first polysilicon layer;

patterning of said first tungsten silicide layer, and of said first polysilicon layer, to form said polycide gate structure;

ion implantation of a first conductivity imparting dopant into regions of said semiconductor substrate, not covered by said polycide gate structure, to form lightly doped source and drain regions;

deposition of a first insulator layer;

anisotropic etching of said first insulator layer to create an insulator spacer on sidewalls of said polycide gate structure;

ion implantation of a second conductivity imparting dopant into regions of said semiconductor substrate, not covered by said polycide gate structures, and not covered by said insulator spacer, to form heavily doped source and drain regions;

deposition of a second insulator layer;

opening a contact hole in said second insulator layer, to expose top surface of said first tungsten silicide layer, of said polycide gate structure, with the width of said contact hole, greater then the width of said polycide gate structure, thus also exposing top surface of said insulator spacer, and surface of remaining said second insulator layer, in said contact hole, in regions surrounding said polycide gate structure;

removal of a portion of said insulator spacer, and of a portion of remaining said second insulator layer, in said contact hole, exposing a portion of the sides of said polycide gate structure, in said contact hole;

deposition of a second polysilicon layer;

deposition of a second tungsten silicide layer; and patterning of said second tungsten silicide layer, and of said second polysilicon layer, to create said bit line metal structure, contacting top surface of said first tungsten silicide layer, of said polycide gate structure, as well as a portion of the sides of said polycide gate structure, in said contact hole.

13. The method of claim 12, wherein said first polysilicon layer is deposited using LPCVD processing, at a temperature between about 530° to 580° C., to a thickness between about 1000 to 2000 Angstroms.

14. The method of claim 12, wherein said first tungsten silicide layer is deposited using LPCVD processing, at a temperature between about 320° to 380° C., to a thickness between about 1000 to 2000 Angstroms.

15. The method of claim 12, wherein said polycide gate structure is formed via dry etching of said first tungsten silicide layer, and of said first polysilicon, using $Cl_2$ as an etchant, with the width of said polycide gate structure between about 2500 to 7000 Angstroms.

16. The method of claim 12, wherein said insulator spacer is silicon oxide, at a width between about 1500 to 4000 Angstroms.

17. The method of claim 12, wherein said second insulator layer is silicon oxide, deposited using PECVD processing, at a temperature between about 300° to 400° C., to a thickness between about 3000 to 10000 Angstroms.

18. The method of claim 12, wherein said contact hole is opened in said second insulator layer via RIE processing, using $CHF_3$ as an etchant, exposing the top surface of said first tungsten silicide layer, of said polycide gate structure, with said contact hole having a width between about 4000 to 10000 Angstroms.

19. The method of claim 12, wherein said contact hole is opened in said second insulator layer via wet etching in a buffered hydrofluoric acid solution, exposing the top surface of said first tungsten silicide layer, of said polycide gate structure, with said contact hole having a width between about 4000 to 10000 Angstroms.

20. The method of claim 12, wherein between about 500 to 1500 Angstroms of said remaining second insulator layer, and of said insulator spacer, in said contact hole, is removed via RIE procedures, using $CHF_3$ as an etchant.

21. The method of claim 12, wherein between about 500 to 1500 Angstroms of said remaining second insulator layer, and of said insulator spacer, in said contact hole, is removed using a buffered hydrofluoric acid solution.

22. The method of claim 12, wherein said bit line metal structure, contacting the top surface of said first tungsten silicide layer, of said polycide gate structure, and contacting a portion of the sides of said polycide gate structure, in said contact hole, is comprised of an overlying, said second tungsten silicide layer, and an underlying, said second polysilicon layer.

* * * * *